(12) United States Patent
Sun

(10) Patent No.: US 8,730,683 B2
(45) Date of Patent: May 20, 2014

(54) ATTACHMENT MECHANISM FOR ELECTRONIC COMPONENT

(75) Inventor: Zheng-Heng Sun, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 156 days.

(21) Appl. No.: 13/463,827

(22) Filed: May 4, 2012

(65) Prior Publication Data

US 2013/0176696 A1    Jul. 11, 2013

(30) Foreign Application Priority Data

Jan. 11, 2012   (CN) .......................... 2012 1 0007254

(51) Int. Cl.
*H01R 12/73* (2011.01)
*H01R 13/62* (2006.01)
*H01R 13/639* (2006.01)

(52) U.S. Cl.
USPC ........... 361/760; 361/759; 361/801; 361/785; 439/329

(58) Field of Classification Search
USPC ............. 361/679.01–679.45, 679.55–679.59, 361/728–749, 755–759; 439/65, 358, 326, 439/67, 493–496, 498–499; 174/15.4–15.5, 174/125.1, 250–268
See application file for complete search history.

(56) References Cited

U.S. PATENT DOCUMENTS

| | | | | |
|---|---|---|---|---|
| 5,199,884 A | * | 4/1993 | Kaufman et al. | 439/74 |
| 5,268,820 A | * | 12/1993 | Tseng et al. | 361/785 |
| 7,004,764 B2 | * | 2/2006 | Boudreau et al. | 439/74 |
| 7,929,317 B2 | * | 4/2011 | Cheng et al. | 361/801 |
| 8,582,315 B2 | * | 11/2013 | Nishiyama | 361/807 |

* cited by examiner

*Primary Examiner* — Robert J Hoffberg
*Assistant Examiner* — Michael Matey
(74) *Attorney, Agent, or Firm* — Novak Druce Connolly Bove + Quigg LLP

(57) ABSTRACT

An attachment mechanism for an electronic component includes a circuit board and a fastener. A first connector is fastened to the circuit board to be connected to a second connector of the electronic component. The first connector includes a mounting portion fastened to the circuit board and a main body on a top of the mounting portion. The fastener includes an engaging portion and a rotating portion rotatably connected to a first end of the engaging portion. The engaging portion sandwiches the main body. The rotating portion includes a top wall and two abutting walls extending from opposite ends of the top wall to abut a top of the main body. One of the abutting walls is rotatably connected to the first end of the engaging portion. A stop wall extends from the other abutting wall to be detachably connected a second end of the engaging portion.

9 Claims, 4 Drawing Sheets

ATTACHMENT MECHANISM FOR ELECTRONIC COMPONENT

CROSS-REFERENCE TO RELATED APPLICATIONS

Relevant subject matter is disclosed in seven pending U.S. patent applications, all titled "ATTACHMENT MECHANISM FOR ELECTRONIC COMPONENT", respectively filed on Mar. 20, 2012, with the application Ser. No. 13/424,390, on Mar. 22, 2012, published as U.S. Patent Application Publication 2013/0149026; with the application Ser. No. 13/426,629, on Mar. 23, 2012, now U.S. Pat. No. 8,608,501; with the application Ser. No. 13/427,923, on Mar. 29, 2012, now U.S. Pat. No. 8,500,457; with the application Ser. No. 13/434,791, on Apr. 12, 2012, published as U.S. Patent Application Publication 2013/0163215; with the application Ser. No. 13/444,874, on Apr. 13, 2012, published as U.S. Patent Application Publication 2013/0164950; with the application Ser. No. 13/445,935, and on Apr. 23, 2012, published as U.S. Patent Application Publication 2013/0163216; and with the application Ser. No. 13/452,956, now U.S. Pat. No. 8,512,063, which are assigned to the same assignee as this patent.

BACKGROUND

1. Technical Field

The present disclosure relates to a mechanism for attaching an electronic component to a device.

2. Description of Related Art

Certain components in a server, such as expansion cards, need to be attached to the motherboard of the server. Taking such an expansion card for example, an end of the expansion card is fastened to the motherboard, and a connector at an opposite end of the expansion card is connected to a connector of the motherboard. However, the connection of the connectors may not be solid enough and the expansion card may disengage from the connector of the motherboard, which adversely influences the data transmission of the server.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
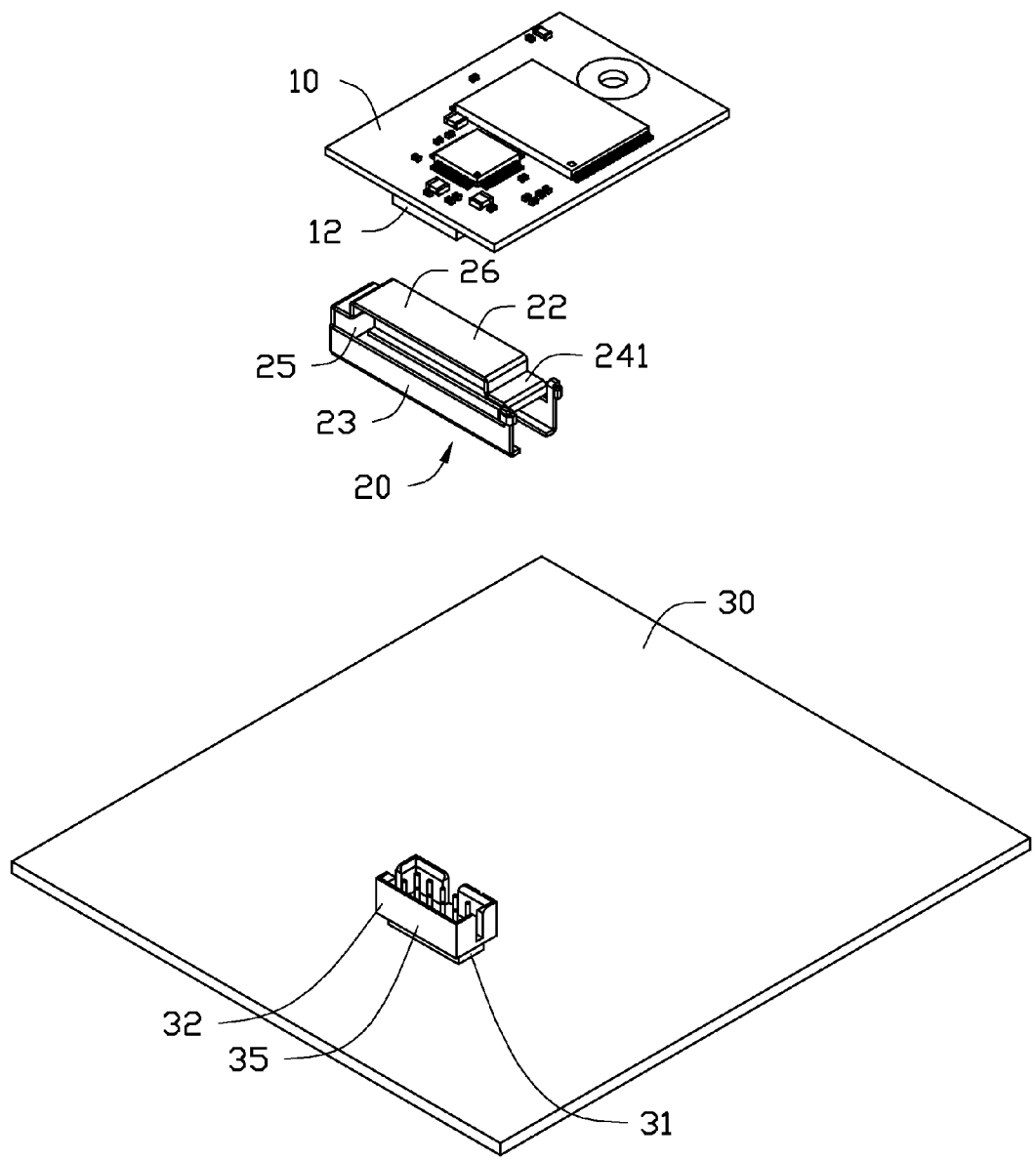
FIG. 1 is an exploded, isometric view of an exemplary embodiment of an attachment mechanism, together with an electronic component, wherein the attachment mechanism includes a fastener.

FIG. 1 shows an exemplary embodiment of an attachment mechanism for fastening an electronic component 10. The attachment mechanism includes a circuit board 30 and a fastener 20. The electronic component 10 includes a first connector 12 mounted to a first end of a bottom surface of the electronic component 10.

A second connector 32 is fastened to the circuit board 30. The second connector 32 includes a small mounting portion 31 fastened to the circuit board 30 and a large main body 35 on a top of the mounting portion 31.

Figure 2:
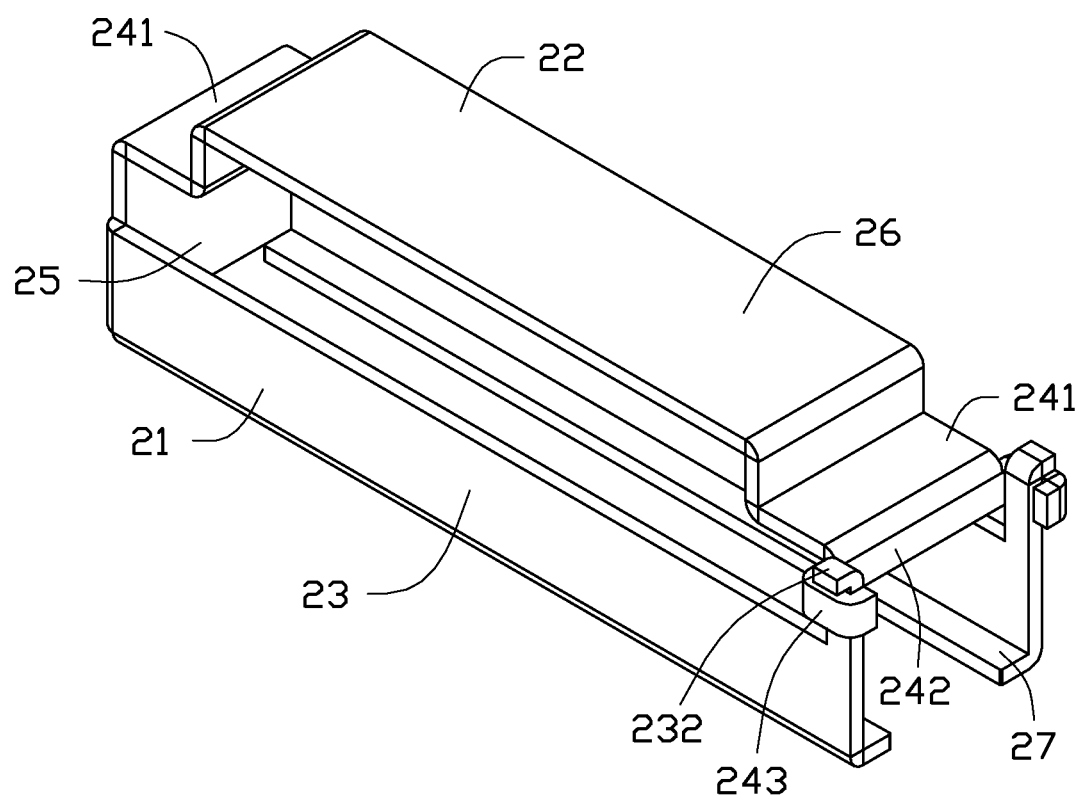
FIG. 2 is an enlarged view of the fastener of FIG. 1.

FIG. 2 shows the fastener 20 including an engaging portion 21 and a rotating portion 26 rotatably connected to the engaging portion 21. The engaging portion 21 includes two opposite sidewalls 23 and a connection wall 25 connected between first ends of the sidewalls 23. The connection wall 25 extends out of tops of the sidewalls 23. Two bars 27 perpendicularly extend from bottoms of the corresponding sidewalls 23 toward each other. Two L-shaped hooks 232 extend up from second ends of the corresponding sidewalls 23, opposite to each other. The second ends of the sidewalls 23 are opposite to the first ends. The rotating portion 26 includes a U-shaped top wall 22, arched up. Two abutting walls 241 extend from opposite ends of the top wall 22, away from each other. One of the abutting walls 241 is perpendicularly and rotatably connected to the connection wall 25. A stop wall 242 extends down from a side of the other abutting wall 241 away from the top wall 22. Two U-shaped latching portions 243 extend from opposite ends of the stop wall 242, facing each other. The hooks 232 engage with the corresponding latching portions 243.

Figure 3:
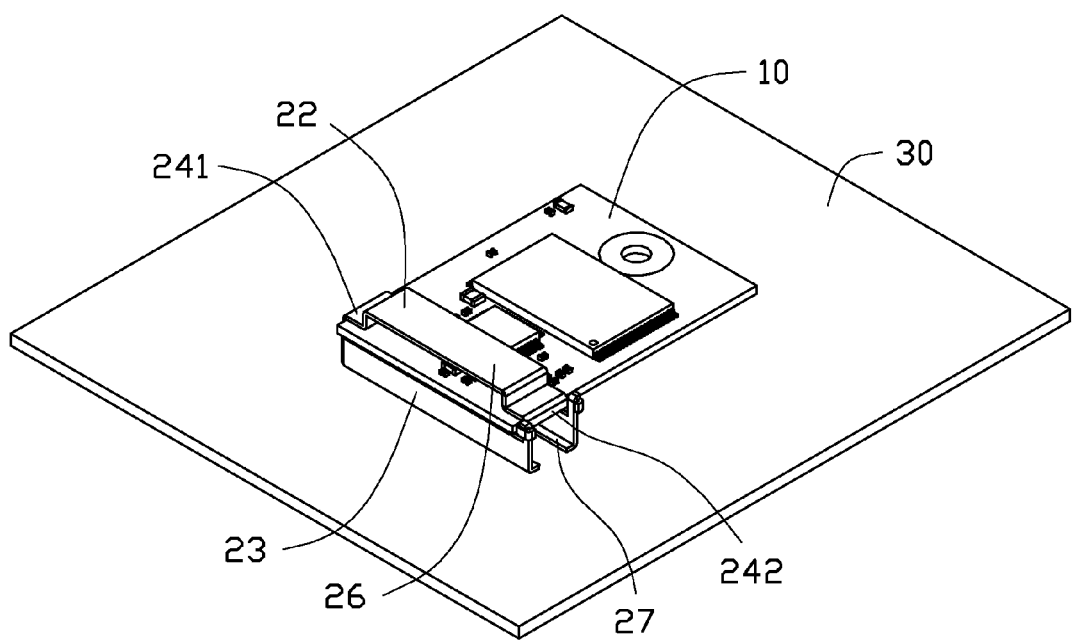
FIG. 3 is an assembled, isometric view of FIG. 1.

FIG. 3 shows in assembly, the sidewalls 23 are manipulated to allow the hooks 232 to be toward each other. The rotating portion 26 is rotated up to disengage the latching portions 243 from the corresponding hooks 232. The end of the fastener 20 away from the connection wall 25 aligns with an end of the second connector 32. The sidewalls 23 are manipulated away from each other, and then the fastener 20 is moved toward the second connector 32. When the connection wall 25 abuts against the main body 35, the sidewalls 23 are released to abut against opposite sides of the main body 35. The fastener 20 is manipulated up to allow the bars 27 to abut against opposite sides of a bottom of the main body 35. The rotating portion 26 is rotated up, the first connector 12 is connected to the second connector 32. The rotating portion 26 is rotated down to allow the latching portions 243 to engage with the corresponding hooks 232. The abutting walls 241 abut against a top of the electronic component 10. The stop wall 242 and the connection wall 25 abut against opposite sides of the first end of the electronic component 10.

Figure 4:
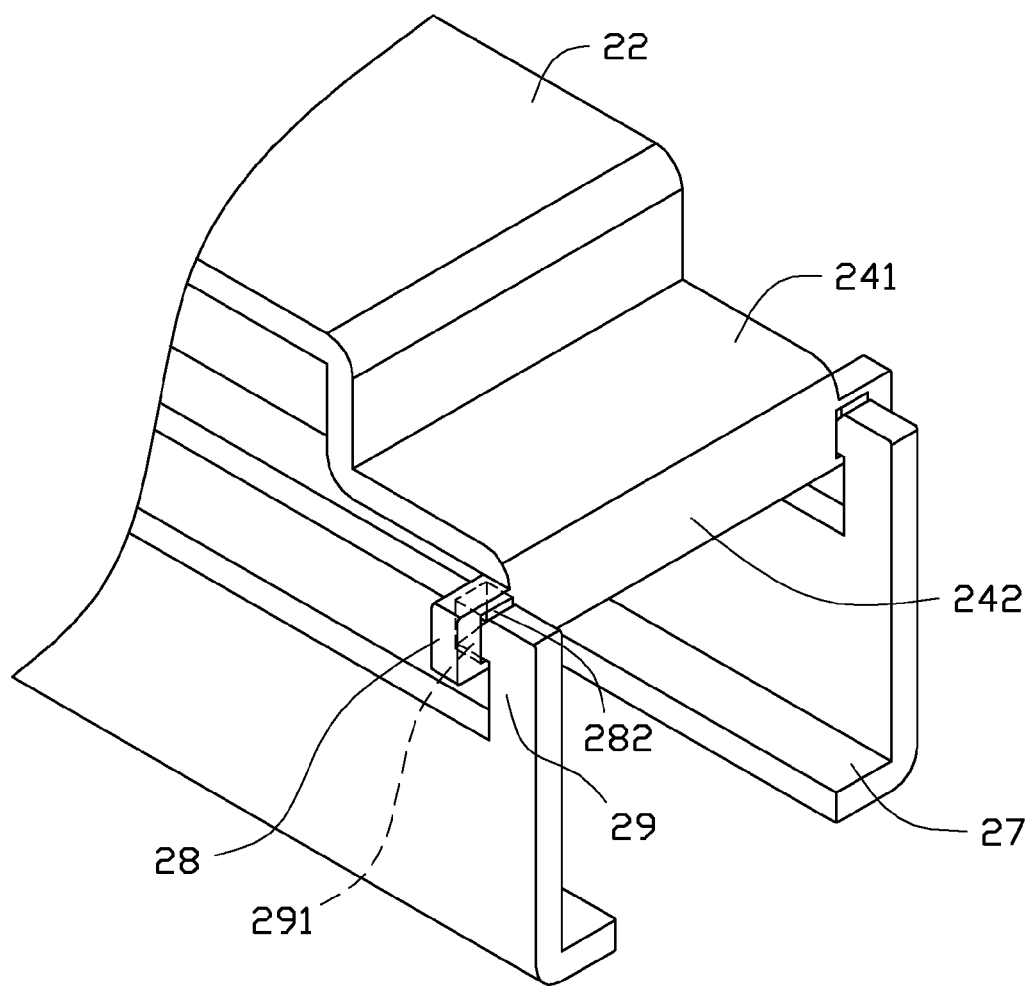
FIG. 4 is an isometric view of a part of a second embodiment of the fastener of FIG. 1.

FIG. 4 shows a second embodiment of the fastener 20. The rotating portion 26 is mounted to the second end of the engaging portion 21 in a different way. Two blocks 28 perpendicularly extend from opposite ends of the stop wall 242. A through slot 282 is defined in each block 28. An extension portion 29 perpendicularly extends up from the second end of each sidewall 23. A latch 291 protrudes from each extension portion 29 to engage in a corresponding through slot 282.

It is believed that the present embodiments and their advantages will be understood from the foregoing description, and various changes may be made thereto without departing from the spirit and scope of the description or sacrificing all of their materials advantages, the examples hereinbefore described merely being exemplary embodiments.

What is claimed is:

1. An attachment mechanism for fastening an electronic component, comprising:
   a circuit board;
   a first connector fastened to the circuit board to be connected to a second connector of the electronic component, the first connector comprising a mounting portion fastened to the circuit board, and a main body on a top of the mounting portion to connect to the second connector; and a fastener comprising:
an engaging portion sandwiching the main body, the engaging portion comprises:
two opposite sidewalls to abut against opposite sides of the main body;
two L-shaped hooks, each of the two L-shaped hooks extends up from a first end of a corresponding sidewall of the two opposite sidewalls, the two L-shaped hooks being opposite to each other;
two U-shaped latching portions, each of the two U-shaped latching portions extends from an opposite end of the stop wall to engage with a corresponding hook of the two L-shaped hooks; and
a bar extending from one of the two opposite sidewalls to abut against a bottom of the main body; and
a rotating portion rotatably connected to a first end of the engaging portion, the rotating portion comprising:
a top wall; and
two abutting walls extending from opposite ends of the top wall to abut against a top of the main body, one of the two abutting walls rotatably connected to the first end of the engaging portion; and
a stop wall extending from another of the two abutting wall to be detachably connected to a second end of the engaging portion for abutting against a first side of the electronic component.

2. The attachment mechanism of claim 1, wherein the engaging portion further comprise a connection wall connected between each of a second end of the corresponding sidewall of the two opposite sidewalls to abut against a second side of the electronic component, the rotating portion is rotatably connected to the connection wall.

3. The attachment mechanism of claim 1, wherein the top wall of the rotating portion is U-shaped, arched up.

4. A circuit board assembly, comprising:
a circuit board;
a first connector comprising a mounting portion fastened to the circuit board and a main body on a top of the mounting portion;
an electronic component comprising a second connector to be connected to the main body of the first connector;
a fastener comprising:
an engaging portion sandwiching the main body, the engaging portion comprises:
two opposite sidewalls to abut against opposite sides of the main body;
two L-shaped hooks, each of the two L-shaped hooks extends up from a first end of a corresponding sidewall of the two opposite sidewalls, the two L-shaped hooks being opposite to each other;
two U-shaped latching portions, each of the two U-shaped latching portions extends from an opposite end of the stop wall to engage with a corresponding hook of the two L-shaped hooks; and
a bar extending from one of the two opposite sidewalls to abut against a bottom of the main body; and
a rotating portion rotatably connected to a first end of the engaging portion, the rotating portion comprising:
a top wall; and
two abutting walls extending from opposite ends of the top wall to abut against a top of the main body, one of the two abutting walls rotatably connected to the first end of the engaging portion; and
a stop wall extending from another of the two abutting wall to be detachably connected to a second end of the engaging portion for abutting against a first side of the electronic component.

5. The circuit board assembly of claim 4, wherein the engaging portion further comprise a connection wall connected between each of a second end of the corresponding sidewall of the two opposite sidewalls to abut against a second side of the electronic component, the rotating portion is rotatably connected to the connection wall.

6. The circuit board assembly of claim 4, wherein the top wall of the rotating portion is U-shaped, arched up.

7. An attachment mechanism for fastening an electronic component, comprising:
a circuit board;
a first connector fastened to the circuit board to be connected to a second connector of the electronic component, the first connector comprising a mounting portion fastened to the circuit board, and a main body on a top of the mounting portion to connect to the second connector; and
a fastener comprising:
an engaging portion sandwiching the main body, the engaging portion comprises:
two opposite sidewalls to abut against opposite sides of the main body;
an extension portion extends up from a first end of each sidewall of the two opposite sidewalls; and
a bar extending from one of the two opposite sidewalls to abut against a bottom of the main body; and
a rotating portion rotatably connected to a first end of the engaging portion, the rotating portion comprising:
a top wall; and
two abutting walls extending from opposite ends of the top wall to abut against a top of the main body, one of the two abutting walls rotatably connected to the first end of the engaging portion; and
a stop wall extending from another of the two abutting wall to be detachably connected to a second end of the engaging portion for abutting against a first side of the electronic component, two blocks extend from opposite ends of the stop wall, a through slot is defined in each block of the two blocks, and a latch protrudes from each extension portion of the engaging portion to engage in a corresponding through slot of the rotating portion.

8. The attachment mechanism of claim 7, wherein the engaging portion further comprise a connection wall connected between each of a second end of the corresponding sidewall of the two opposite sidewalls to abut against a second side of the electronic component, the rotating portion is rotatably connected to the connection wall.

9. The attachment mechanism of claim 7, wherein the top wall of the rotating portion is U-shaped, arched up.

* * * * *